(12) United States Patent
Clay et al.

(10) Patent No.: US 11,749,500 B1
(45) Date of Patent: Sep. 5, 2023

(54) REAL TIME PHOTORESIST OUTGASSING CONTROL SYSTEM AND METHOD

(71) Applicant: Applied Materials, Inc., Santa Clara, CA (US)

(72) Inventors: Nevin Clay, Charlestown, MA (US); David Roger Timberlake, Lexington, MA (US); Christopher W. Campbell, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/582,655

(22) Filed: Jan. 24, 2022

(51) Int. Cl.
*H01J 37/304* (2006.01)
*H01J 37/317* (2006.01)
*H01J 37/20* (2006.01)

(52) U.S. Cl.
CPC ............ *H01J 37/304* (2013.01); *H01J 37/20* (2013.01); *H01J 37/3171* (2013.01); *H01J 2237/20228* (2013.01); *H01J 2237/24564* (2013.01); *H01J 2237/24585* (2013.01)

(58) Field of Classification Search
CPC ...... H01J 37/304; H01J 37/20; H01J 37/3171; H01J 2237/20228; H01J 2237/24564; H01J 2237/24858
See application file for complete search history.

(56) References Cited

U.S. PATENT DOCUMENTS

| | | | |
|---|---|---|---|
| 6,639,231 B1 * | 10/2003 | Simmons | H01J 37/3171 315/111.81 |
| 6,797,967 B1 * | 9/2004 | Tse | H01J 37/3171 250/492.1 |
| 7,586,110 B1 | 9/2009 | Low | |
| 7,615,748 B2 | 11/2009 | Walther et al. | |
| 2007/0125957 A1 | 6/2007 | Low et al. | |
| 2014/0273420 A1* | 9/2014 | Cheng | H01J 37/3171 118/712 |
| 2015/0270099 A1 | 9/2015 | Olson | |
| 2016/0042915 A1* | 2/2016 | Sano | H01J 37/244 250/492.3 |

FOREIGN PATENT DOCUMENTS

KR 20080075543 A 8/2008

OTHER PUBLICATIONS

International Search Report and Written Opinion dated May 9, 2023 in corresponding PCT application No. PCT/US2023/010274.

* cited by examiner

*Primary Examiner* — Sean M Luck
(74) *Attorney, Agent, or Firm* — Nields, Lemack & Frame, LLC (57) ABSTRACT

A system and method for controlling an amount of outgassing caused by implanting ions into a photoresist disposed on a workpiece. The amount of outgassing is based on the species being implanted, the type of photoresist, the energy of the implant, and the amount of dose that has already been implanted, among other effects. By controlling the effective beam current, the amount of outgassing may be maintained below a predetermined threshold. By developing and utilizing the relationship between effective beam current, dose completed and rate of outgassing, the effective beam current may be controlled more precisely to implant the workpiece in the most efficient manner while remaining below the predetermined outgassing threshold.

20 Claims, 5 Drawing Sheets

REAL TIME PHOTORESIST OUTGASSING CONTROL SYSTEM AND METHOD

FIELD

Embodiments of the present disclosure relate to a system and method for controlling outgassing caused by implanting a species into a photoresist disposed on a workpiece.

BACKGROUND

Ion implantation is a common technique to introduce impurities into a workpiece to affect the conductivity of portions of that workpiece. For example, ions that contain elements in Group III, such as boron, aluminum and gallium, may be used to create P-type regions in a silicon workpiece. Ions that contain elements in Group V, such as phosphorus and arsenic, may be used to create N-type regions in the silicon workpiece.

To implant these ions into selected portions of the workpiece, a photoresist is typically applied to the surface of the workpiece in those regions where ions are not to be implanted. This process may be known as patterning the workpiece. The photoresist typically reduces the number of ions that are able to implant the workpiece beneath the photoresist. In this way, only the regions that are not covered with the photoresist are implanted with ions.

However, in certain embodiments, the process of implanting ions into the photoresist may result in outgassing. In certain systems, there may be a maximum allowable outgassing rate that is permissible. To remain below this maximum allowable outgassing rate, the beam current is reduced. This results in lower utilization and decreased throughput.

Therefore, it would be advantageous if there were a system and method that implanted ions into a patterned workpiece in a more efficient manner.

SUMMARY

A system and method for controlling an amount of outgassing caused by implanting ions into a photoresist disposed on a workpiece. The amount of outgassing is based on the species being implanted, the type of photoresist, the energy of the implant, and the amount of dose that has already been implanted, among other effects. By controlling the effective beam current, the amount of outgassing may be maintained below a predetermined threshold. By developing and utilizing the relationship between effective beam current, dose completed and rate of outgassing, the effective beam current may be controlled more precisely to implant the workpiece in the most efficient manner while remaining below the predetermined outgassing threshold.

According to one embodiment, a method of implanting ions of a certain species into a workpiece coated with a photoresist material so as to maintain a rate of outgassing below a threshold is disclosed. The method comprises determining a relationship between effective beam current, dose completed and the rate of outgassing; using the relationship to determine an effective beam current, based on a dose completed, to be used for one or more passes as the workpiece is implanted; implanting the ions using the effective beam current during the one or more passes; and repeating the using and implanting a plurality of times. In some embodiments, the ions are extracted from an ion source and the using and implanting are repeated until the effective beam current is equal to or greater than a maximum beam current that can be extracted from the ion source. In some embodiments, after the effective beam current is equal to or greater than the maximum beam current, the method further comprises implanting the ions using the maximum beam current until a desired dose has been implanted. In certain embodiments, the ions are extracted from an ion source and the effective beam current is varied after each pass until the effective beam current is equal to or greater than a maximum beam current that can be extracted from the ion source. In some embodiments, the ions are extracted from an ion source and the effective beam current is changed without changing operating parameters of the ion source. In some embodiments, the workpiece is disposed on a movable workpiece holder and the effective beam current is varied by modifying a workpiece scan speed of the movable workpiece holder. In some embodiments, a blocker is configured such that it may be moved so as to enter a path of the ions, and the effective beam current is varied by moving the blocker into the path of the ions to block some or all of the ions. In some embodiments, a scanner is used to create a ribbon ion beam from a spot beam and the effective beam current is varied by modifying a beam scan frequency of the scanner. In some embodiments, the relationship is determined using a calibration process. In certain embodiments, the calibration processes comprises implanting an ion beam of the certain species into a workpiece, the workpiece coated with the photoresist material; wherein the ion beam comprises a beam current; measuring a pressure at the workpiece during the implanting, wherein the pressure is indicative of the rate of outgassing; calculating an implanted dose for the workpiece after each pass of the ion beam; repeating the directing, measuring and calculating for a plurality of workpieces, each implanted using a different beam current; and determining the relationship between effective beam current, dose completed and the rate of outgassing based on the calculated implanted dose, the pressure and the beam current of each ion beam.

According to another embodiment, an ion implantation system is disclosed. The ion implantation system comprises an ion source; a mass analyzer; a mass resolving device; a collimator; a movable workpiece holder; and a controller; wherein the controller comprises a memory device comprising instructions, which when executed by the controller enable the ion implantation system to: determine an effective beam current to be used for one or more passes as a workpiece coated with a photoresist material is implanted using a previously determined relationship between effective beam current, rate of outgassing and dose completed; implant ions of a certain species using the effective beam current during the one or more passes; and repeat the determining and implanting a plurality of times. In some embodiments, the controller repeats the determining and implanting until the effective beam current is equal to or greater than a maximum beam current that can be extracted from the ion source. In certain embodiments, after the effective beam current is equal to or greater than the maximum beam current, the controller implants the ions using the maximum beam current until a desired dose has been implanted. In some embodiments, the controller varies the effective beam current after each pass until the effective beam current is equal to or greater than a maximum beam current that can be extracted from the ion source. In some embodiments, the workpiece is disposed on the movable workpiece holder and the controller varies the effective beam current by modifying a workpiece scan speed of the movable workpiece holder. In certain embodiments, the ion source creates a spot beam and the ion implantation system comprises a scanner to create a ribbon ion beam from the spot beam; and the controller varies the effective beam current by modifying a beam scan frequency of the scanner. In some embodiments, the ion implantation system further comprises a blocker configured such that it may be moved so as to enter a path of the ions, and the controller varies the effective beam current by moving the blocker into the path of the ions to block some or all of the ions. In some embodiments, the previously determined relationship is determined by the controller by performing a calibration process. In some embodiments, the calibration process comprises directing an ion beam of the certain species toward a workpiece, the workpiece coated with the photoresist material; wherein the ion beam comprises a beam current; measuring a pressure at the workpiece during the implanting, wherein the pressure is indicative of the rate of outgassing; calculating an implanted dose for the workpiece after each pass of the ion beam; repeating the directing, measuring and calculating for a plurality of workpieces, each implanted using a different beam current; and determining a relationship between effective beam current, dose completed and the rate of outgassing based on the calculated implanted dose, the pressure and the beam current of each ion beam. In some embodiments, the controller varies the effective beam current without changing operating parameters of the ion source.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
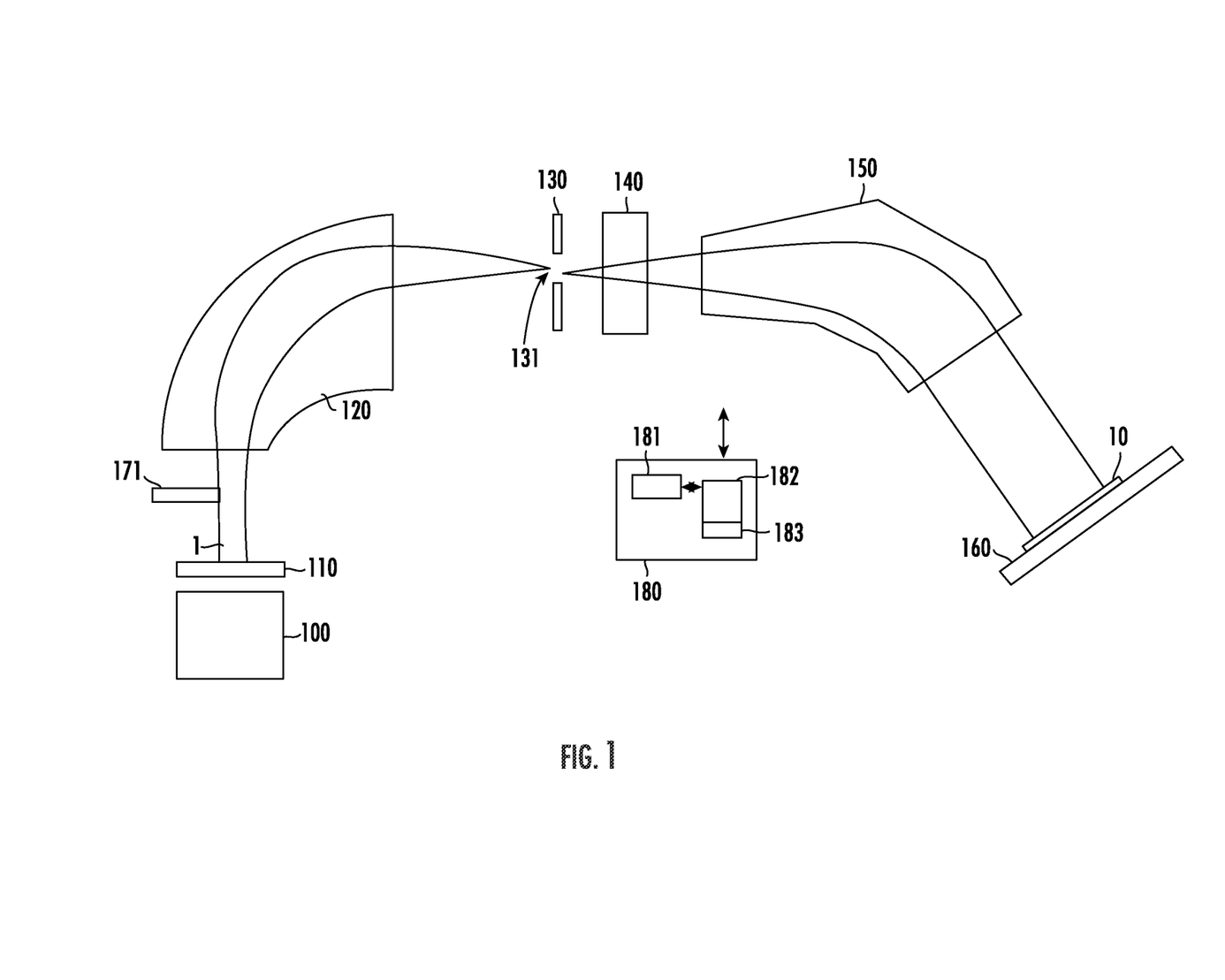
FIG. 1 is an ion implanter that utilizes a spot beam according to one embodiment.

FIG. 1 shows a spot beam ion implantation system that may be used for implanting ions into a patterned workpiece using a spot beam according to one embodiment.

The spot beam ion implantation system includes an ion source 100 comprising a plurality of chamber walls defining an ion source chamber. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 100 are extraction optics 110. In certain embodiments, the extraction optics 110 comprise one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics are aligned such that the ions 1 pass through both apertures.

Located downstream from the extraction optics 110 is a mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system. The ions that pass through the mass resolving device 130 may form a spot beam.

The spot beam may then enter a scanner 140 which is disposed downstream from the mass resolving device 130. The scanner 140 causes the spot beam to be fanned out into a plurality of divergent beamlets. The scanner 140 may be electrostatic or magnetic. In certain embodiments, a collimator 150 then converts these divergent beamlets into a plurality of parallel beamlets that are directed toward the workpiece 10. In other embodiments, a collimator 150 may not be employed.

The workpiece 10 is disposed on a movable workpiece holder 160.

In certain embodiments, the direction of the ion beam is referred to as the Z-direction, the direction perpendicular to this direction and horizontal may be referred to as the X-direction, while the direction perpendicular to the Z-direction and vertical may be referred to as the Y-direction. In this example, it is assumed that the scanner 140 scans the spot beam in the X-direction while the movable workpiece holder 160 is translated in the Y-direction. The rate at which the movable workpiece holder 160 moves in the Y direction may be referred to as the workpiece scan speed. The rate at which the scanner 140 scans the spot beam in the X-direction may be referred to as beam scan frequency.

The movable workpiece holder 160 moves in the Y direction from a first position, which may be above the ion beam to a second position, which may be below the ion beam. The movable workpiece holder 160 then moves from the second position back to the first position. Thus, in the first position and the second position, the workpiece may not be impacted by the ion beam. However, the workpiece 10 is impacted as the movable workpiece holder 160 moves between these two positions.

A pass may be defined as the period of time wherein the movable workpiece holder 160 is moving from the first position to the second position, or is moving from the second position to the first position. In other words, a pass is defined as the period of time during which the entirety of the workpiece 10 is exposed to the ion beam once.

A controller 180 is also used to control the system. The controller 180 has a processing unit 181 and an associated memory device 182. This memory device 182 contains the instructions 183, which, when executed by the processing unit, enable the system to perform the functions described herein. This memory device 182 may be any non-transitory storage medium, including a non-volatile memory, such as a FLASH ROM, an electrically erasable ROM or other suitable devices. In other embodiments, the memory device 182 may be a volatile memory, such as a RAM or DRAM. In certain embodiments, the controller 180 may be a general purpose computer, an embedded processor, or a specially designed microcontroller. The actual implementation of the controller 180 is not limited by this disclosure. The controller 180 may be in communication with the ion source 100, the scanner 140 and the movable workpiece holder 160 and may be configured to modify the operating parameters of these components.

Figure 2:
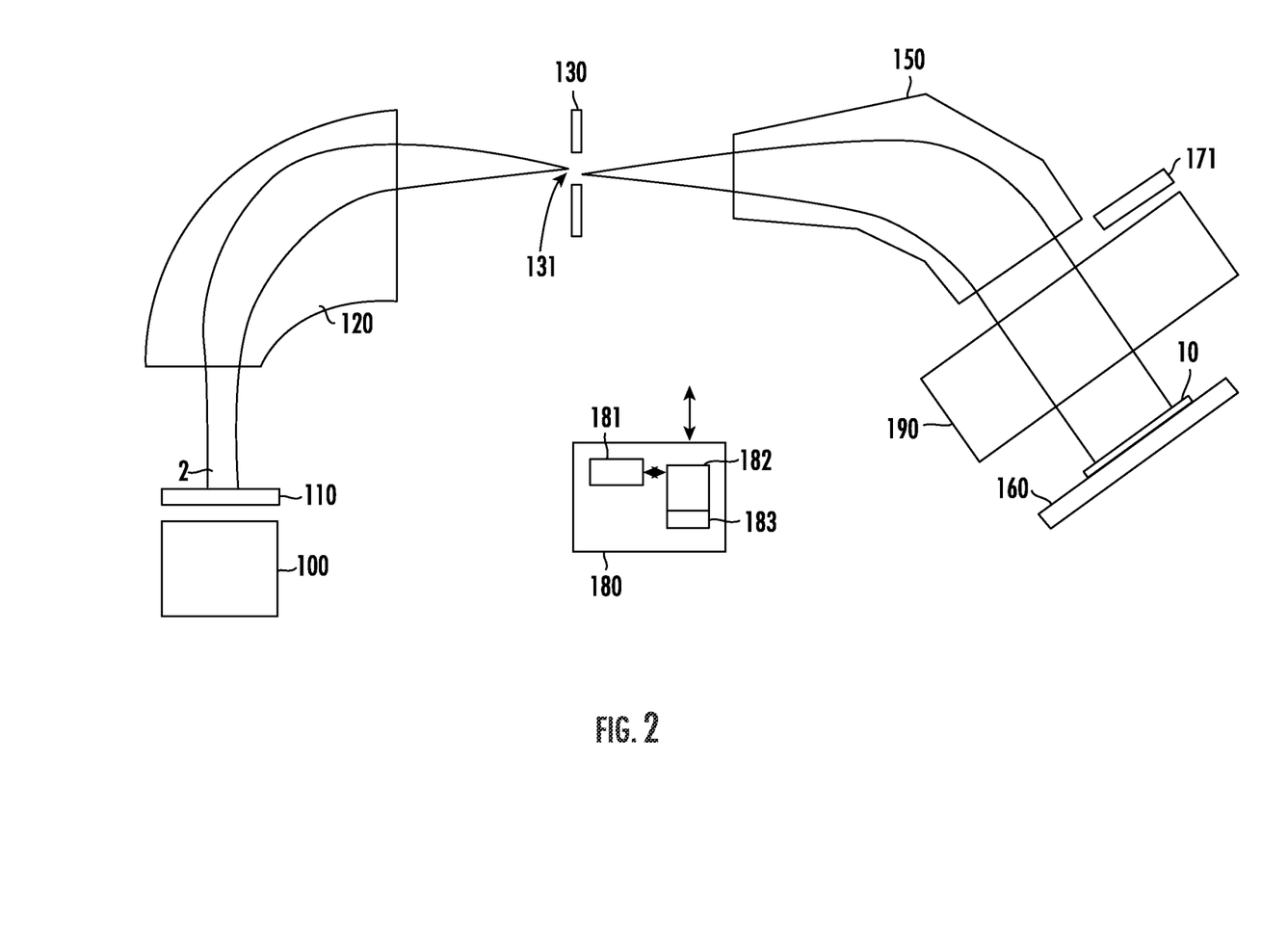
FIG. 2 shows an ion implanter that utilizes a ribbon ion beam according to one embodiment.

FIG. 2 shows an ion implantation system using a ribbon ion beam. Components with the same function as those shown in FIG. 1 have been given identical reference designators. An ion source 100 is used to create ions. Any of the ion sources described with respect to FIG. 1 may be utilized. Unlike FIG. 1, the extraction aperture of the ion source 100 may be an elongated slot, having a width much greater than its height. In this way, the extracted ions 2 are in the form of a ribbon ion beam. Disposed outside and proximate the extraction aperture of the ion source 100 are the extraction optics 110.

Located downstream from the extraction optics 110 is a mass analyzer 120. The mass analyzer 120 uses magnetic fields to guide the path of the extracted ions 2. The magnetic fields affect the flight path of ions according to their mass and charge. A mass resolving device 130 that has a resolving aperture 131 is disposed at the output, or distal end, of the mass analyzer 120. The mass resolving device 130 is placed at the crossover point of the ribbon ion beam. By proper selection of the magnetic fields, only those extracted ions 2 that have a selected mass and charge will be directed through the resolving aperture 131. Other ions will strike the mass resolving device 130 or a wall of the mass analyzer 120 and will not travel any further in the system.

A collimator 150 may disposed downstream from the mass resolving device 130. The collimator 150 accepts the extracted ions 2 that pass through the resolving aperture 131 and creates a ribbon ion beam formed of a plurality of parallel or nearly parallel beamlets. The output, or distal end, of the mass analyzer 120 and the input, or proximal end, of the collimator 150 may be a fixed distance apart. The mass resolving device 130 is disposed in the space between these two components.

Located downstream from the collimator 150 may be an acceleration/deceleration stage 190. The acceleration/deceleration stage 190 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 190 is the movable workpiece holder 160.

A controller 180 is also used to control the system. The controller 180 has a processing unit 181 and an associated memory device 182. This memory device 182 contains the instructions 183, which, when executed by the processing unit, enable the system to perform the functions described herein. The controller 180 may be in communication with the ion source 100 and the movable workpiece holder 160 and may be configured to modify the operating parameters of these components.

It has been found that a relationship between outgassing rate, effective beam current and dose completed exists for each type of workpiece, where the workpiece is coated with a specific photoresist material and implanted with a certain species. Stated differently, the outgassing rate is a function of the dose completed, the effective beam current, the photoresist material and the species being implanted.

In other words, the rate of outgassing is related to the photoresist material and the species that is being implanted into that photoresist material. Additionally, as more dose has been completed, the rate of outgassing typically decreases, as there is less trapped gas remaining in the photoresist material to be outgassed. Thus, if a maximum rate of outgassing is established, a graph may be created that represents the relationship between the maximum effective beam current that may be used and the dose completed.

Figure 3:
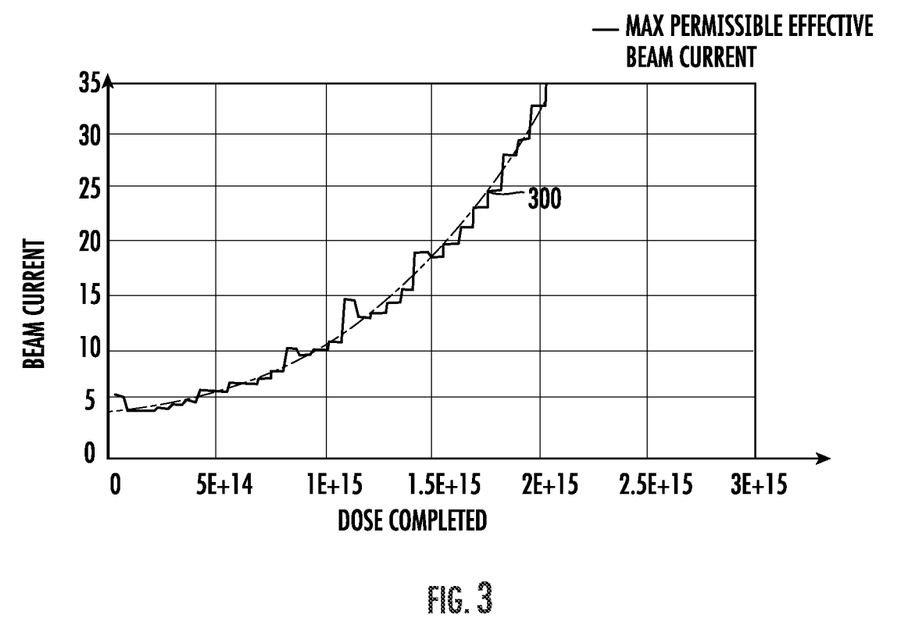
FIG. 3 shows a graph illustrating a relationship between beam current and dose completed to achieve an allowable rate of outgassing.

One such graph is shown in FIG. 3. In this particular example, a beam of boron was implanted into a workpiece coated with a photoresist. The beam energy was set to 130 kV and the boron was implanted at an angle of 0°.

The horizontal axis represents the dose that has already been completed, while the vertical axis indicates the effective beam current in milliamps. Line 300 indicates the maximum effective beam current that may be utilized without exceeding the maximum rate of outgassing.

In one embodiment, these relationships may be created by performing a calibration process. In the calibration process, a pressure sensor may be disposed near the workpiece. One or more workpieces having the photoresist coating may be utilized. The ion implantation system may be configured to supply an ion beam with certain parameters, such as the desired species, beam energy and implant angle. The one or more workpieces are then implanted using ion beam with these certain parameters and different beam currents. As the ion beam strikes the photoresist, gas is emitted, which may be detected by the pressure sensor. Further, as the workpiece is implanted, the dose completed is determined. Using the beam current, the dose completed and the reading of the pressure sensor, the amount of outgassing at a particular beam current and dose may be determined.

Performing this procedure using a plurality of workpieces and beam currents provides data showing the amount of outgassing as a function of completed dose for the different beam currents. This data can then be interpolated to identify the maximum effective beam current that may be utilized without exceeding the outgassing limit at each dose for that implant.

Note that the rate of outgassing is also a function of the percentage of the workpiece on which the photoresist material is disposed. For example, if the photoresist covers 25% of the workpiece, the rate of outgassing may be about 50% of the rate of outgassing experienced by a workpiece where 50% of the surface is covered by the photoresist. In certain embodiments, the relationship between percentage of the photoresist coverage and rate of outgassing is roughly linear. In other embodiments, a different relationship may exist, based on other effects, such as cryopump response and other factors.

In another embodiment, the relationship between these parameters may be calculated theoretically. For example, a large amount of data may be collected which enables the creation of theoretical models that may be used to estimate the relationship between effective beam current, the dose completed and the rate of outgassing.

Once a graph similar to that shown in FIG. 3 is created, the ion implantation process may be performed. In one embodiment, the graph is used to create an equation that computes the effective beam current versus dose completed for a particular implant species, implant angle, photoresist coverage percentage and photoresist material. This graph may be created using least squares fit or some other technique. The controller 180 may then use this graph or this equation to control the implantation system. In another embodiment, the data is used to create the equation without the generation of the graph.

The effective beam current may be controlled in a number of ways. For example, for an IHC ion source, the power supplied to the cathode or filament may be varied by the controller 180 to change a density of the plasma within the ion source. For a RF ion source, the power supplied to the antenna may be varied by the controller 180 to change the density of the plasma within the ion source. This is applicable to the implantation system shown in FIG. 1 or in FIG. 2.

In certain embodiments, to minimize the time to tune the ion source, the operating parameters of the ion source 100 are left unchanged. Rather, other techniques are used to vary the effective beam current that do not involve changing operating parameters of the ion source.

For example, the effective beam current may be varied by changing the workpiece scan rate of the movable workpiece holder 160. This is applicable to the implantation system shown in FIG. 1 or in FIG. 2. For example, a faster workpiece scan rate results in less ions being implanted during each pass. This is effectively a reduction in beam current. Conversely, a slower workpiece scan rate results in more ions being implanted during each pass. This is effectively an increase in beam current.

Alternatively, or additionally, the effective beam current may be varied by changing the beam scan frequency of the scanner 140. For example, a faster beam scan frequency results in less ions being implanted during each pass. This is effectively a reduction in beam current. Conversely, a slower beam scan frequency results in more ions being implanted during each pass. This is effectively an increase in beam current. This is applicable to the implantation system shown in FIG. 1.

Alternatively, or additionally, a blocking member may be configured such that it may be moved in the path of the ion beam. In certain embodiments, as shown in FIG. 1, this blocking member 171 may be disposed near the entrance to the mass analyzer 120. In other embodiments, such as shown in FIG. 2, the blocking member 171 may be disposed near the end of the beamline, such as at the output of the collimator 150. In other embodiments, the blocking member may be disposed near the resolving aperture 131, such as immediately before or after the resolving aperture 131. To vary the effective beam current, the blocking member 171 may be moved into the path of the ions to block some or all of the ions in the path. Note that while FIG. 1 shows the blocking member 171 located near the ion source 100, it may be disposed in other locations. Similarly, while FIG. 2 shows the blocking member 171 located near the end of the beamline, it may be disposed in other locations.

In addition to physically blocking the ion beam, the ion beam may be electrically diverted. For example, a diverter may be disposed in the acceleration/deceleration stage 190. This diverter may be used to divert the ion beam away from the workpiece 10 by application of an AC voltage. This diverter may be disposed in other components in the beam line, or may be a separate component.

In one embodiment, the controller 180 may configure the ion source 100 to extract a maximum amount of beam current. This maximum amount of beam current may result in an unacceptable rate of outgassing during the earlier passes of the workpiece. Thus, during the earlier passes, the controller 180 may reduce the effective beam current to achieve an acceptable rate of outgassing by performing one or more of the following:

manipulating the workpiece scan speed,
manipulating the beam scan frequency,
using a diverter, and/or
inserting a blocking member.

Figure 5:
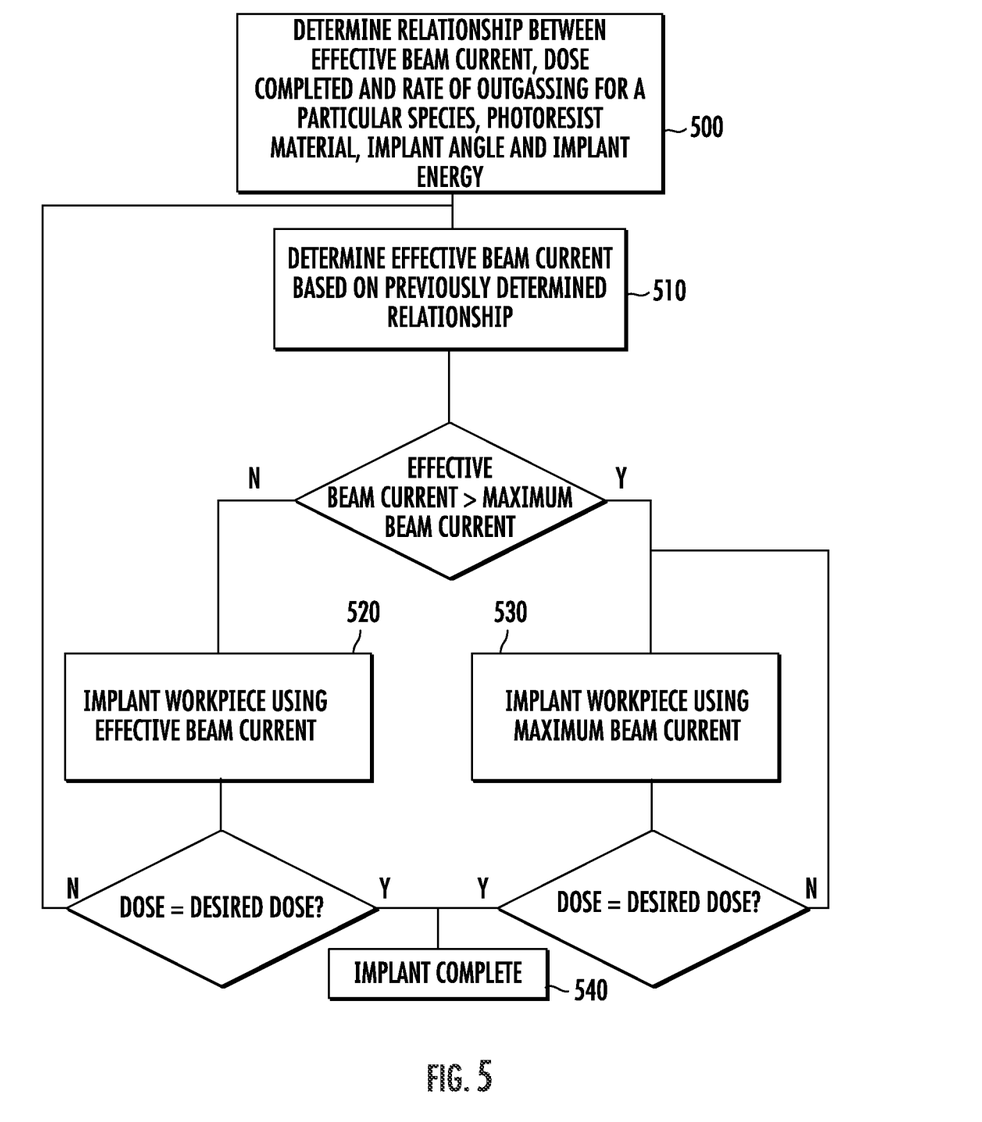
FIG. 5 shows a flowchart that may be used to implant a workpiece covered with a photoresist material according to one embodiment.

FIG. 5 shows a flowchart that illustrates the operation of the implantation system. This operation is executed by the controller 180, executing the instructions 183 disposed in the memory device 182.

First, as shown in Box 500, a relationship between effective beam current, dose completed and rate of outgassing for a particular implant species, implant angle, photoresist material and implant energy is determined. In certain embodiments, the relationship is determined by performing the calibration process described above. In other embodiments, this relationship is determined theoretically based on previously collected data.

Note that in certain embodiments, the calibration process is performed by the controller 180 associated with the implantation system that performs the implant process. However, in other embodiments, the calibration process may be performed using a different controller. For example, the calibration process may be performed by the system vendor or using a reference system. In this embodiment, the relationship that was determined during the calibration process is supplied to the controller 180 that is associated with the implantation system that is performing the implant process. In another embodiment, the predetermined relationship may be determined theoretically and provided to the controller 180. Thus, in each embodiment, the controller 180 utilizes a previously determined relationship between effective beam current, dose completed and rate of outgassing.

Next, as shown in Box 510, the controller 180 uses this relationship to determine an appropriate effective beam current that will not exceed the allowable rate of outgassing. As an example, initially, no ions have been implanted, so that dose completed is set to zero. The controller 180 then determines an appropriate beam current so as not to exceed the allowable rate of outgassing.

Next, as shown in Box 520, the controller 180 then performs an implant of the workpiece using the effective beam current. This effective beam current may be used for a single pass, or a plurality of passes, such as 2 passes, 4 passes, 10 passes, 25 passes, 50 passes, 100 passes or more. As noted above, a pass is defined as the period wherein the movable workpiece holder 160 moves from the first position to the second position, or from the second position to the first position, such that an entirety of the workpiece is exposed to the ion beam once.

After each pass or set of passes, system returns to Box 510, where the controller 180 may then determine a new effective beam current, based on the dose already completed, that achieves the acceptable rate of outgassing. The controller 180 then adjusts the effective beam current by performing one or more of the actions listed above.

After determining a new effective beam current, the controller then performs another pass or set of passes using the new effective beam current, as shown in Box 520. In some embodiments, the effective beam current is changed after each pass. In other embodiments, the effective beam current is changed after 2 passes, 4 passes, 10 passes, 25 passes, 50 passes, 100 passes or more passes. This process of determining and implanting may be repeated until the maximum amount of beam current that is being extracted from the ion source results in an acceptable rate of outgassing. In other words, the controller 180 may repeat Boxes 510 and 520 until the effective beam current, as determined based on the relationship, exceeds the maximum beam current that can be supplied by the implantation system. The controller 180 may then simply allow the implantation process to continue to completion without any further manipulation of the effective beam current, as shown in Box 530. This process repeats until the desired dose has been implanted, as shown in Box 540. Thus, in certain embodiments, the effective beam current is changed at least two times during the implant process. In other embodiments, the effective beam current is changed at least three times during the implant process.

Figure 4:
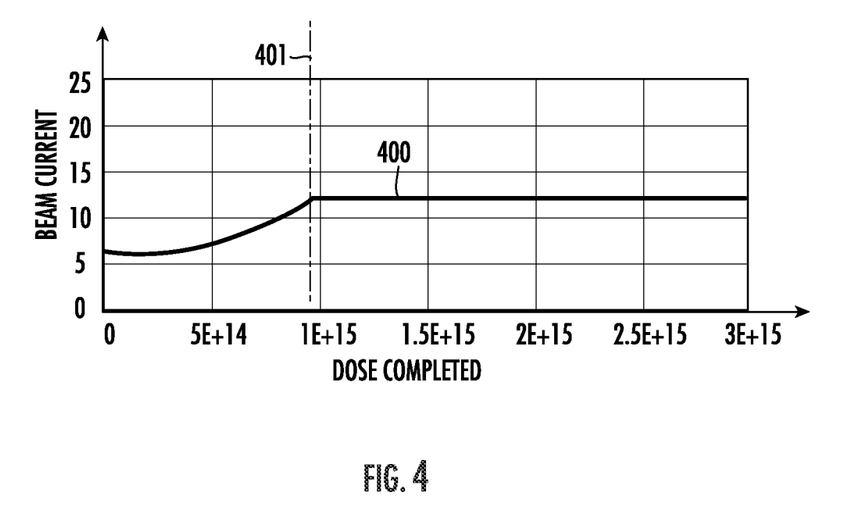
FIG. 4 shows the beam current used to implant a workpiece using the graph of FIG. 3.

An example of this operation is shown in FIG. 4. In FIG. 4, line 400 represents the effective beam current that is applied as the workpiece is being implanted. Until time 401, the effective beam current is constrained by the controller 180 using one or more of the techniques described above, or another technique. However, after time 401, the maximum beam current that can be extracted from the ion source 100 is implanted into the workpiece. In this example, it was assumed that the maximum extracted current was 12 mA. If the actual maximum extracted current was smaller, time 401 would move to the left. If the actual maximum extracted current was larger, time 401 would move to the right and the line 400 would follow the contour of line 300 until time 401.

The embodiments described above in the present application may have many advantages. In many conventional implantation systems, the entire implant is performed at a lower beam current, such that the beam current never causes the rate of outgassing to exceed the threshold.

Figure 6:
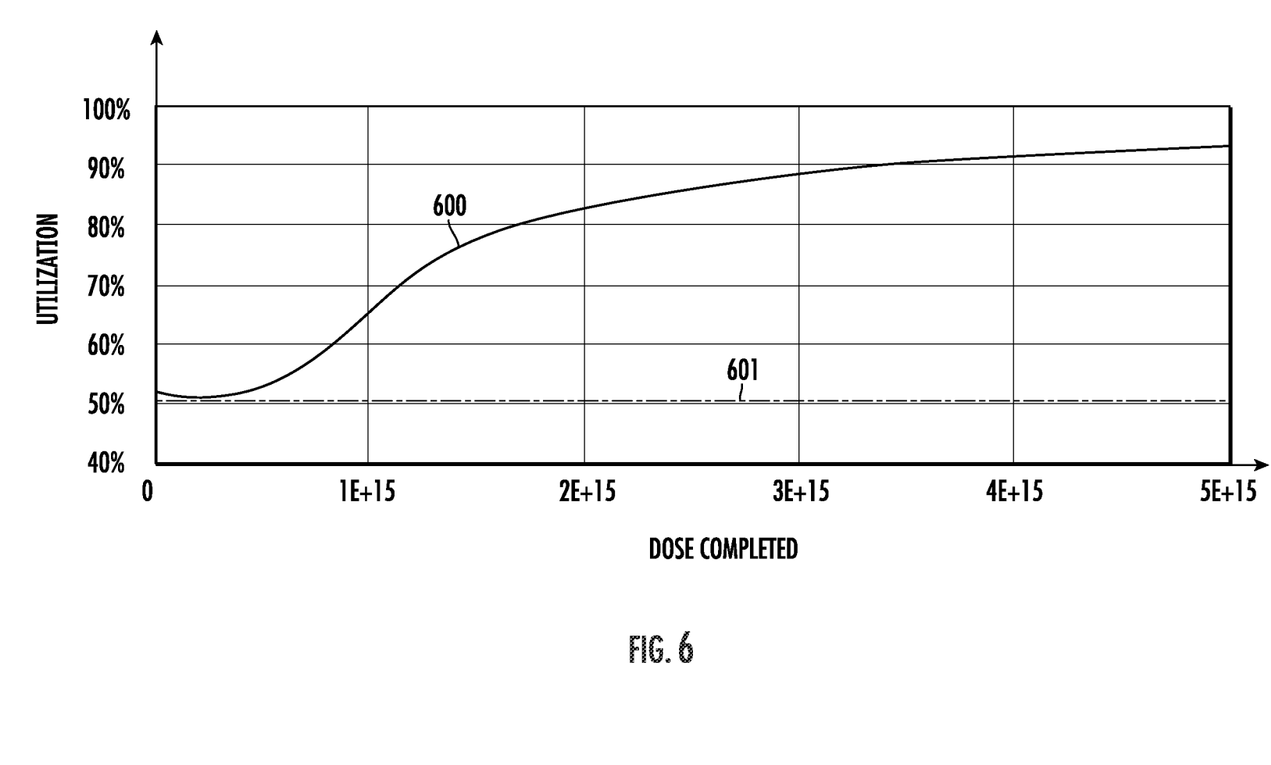
FIG. 6 shows a comparison of throughput utilization for various methods of implanting.

FIG. 6 is a graph showing the comparison of throughput utilization for various doses using this conventional method and the method disclosed herein. Line 600 shows the throughput utilization using the present method. In this example, the beam current follows the graph of FIG. 3 until the allowable beam current reaches the maximum extracted current from the ion source. Line 601 represents the throughput utilization of the conventional method. In this illustration, it is assumed that the conventional method performs the implant at 50% of the maximum current that may be extracted from the ion source so that the rate of outgassing does not exceed a predetermined threshold.

Note that for implants where the desired concentration is between 1E+15 and 2E+15 or less, the present method achieves an improvement in throughput utilization of at least 15% to 30%, as compared to line 601.

Further, in certain embodiments, the present disclosure varies the effective beam current without changing the operating parameters of the ion source. This allows very quick transitions between passes. In contrast, changing the operating parameters of the ion source is typically followed by a tuning process, which may take many second or even several minutes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting ions of a certain species into a workpiece coated with a photoresist material so as to maintain a rate of outgassing below a threshold, the method comprising:
    determining a relationship between effective beam current, dose completed and the rate of outgassing;
    using the relationship to determine an effective beam current, based on a dose completed, to be used for one or more passes as the workpiece is implanted;
    implanting the ions using the effective beam current during the one or more passes; and
    repeating the using and implanting a plurality of times.

2. The method of claim 1, wherein the ions are extracted from an ion source and wherein the using and implanting are repeated until the effective beam current is equal to or greater than a maximum beam current that can be extracted from the ion source.

3. The method of claim 2, wherein after the effective beam current is equal to or greater than the maximum beam current, the method further comprises implanting the ions using the maximum beam current until a desired dose has been implanted.

4. The method of claim 1, wherein the ions are extracted from an ion source and wherein the effective beam current is varied after each pass until the effective beam current is equal to or greater than a maximum beam current that can be extracted from the ion source.

5. The method of claim 1, wherein the ions are extracted from an ion source and the effective beam current is changed without changing operating parameters of the ion source.

6. The method of claim 1, wherein the workpiece is disposed on a movable workpiece holder and the effective beam current is varied by modifying a workpiece scan speed of the movable workpiece holder.

7. The method of claim 1, wherein a blocker is configured such that it may be moved so as to enter a path of the ions, and the effective beam current is varied by moving the blocker into the path of the ions to block some or all of the ions.

8. The method of claim 1, wherein a scanner is used to create a ribbon ion beam from a spot beam and the effective beam current is varied by modifying a beam scan frequency of the scanner.

9. The method of claim 1, wherein the relationship is determined using a calibration process.

10. The method of claim 9, wherein the calibration process comprises:
   directing an ion beam of the certain species toward a workpiece, the workpiece coated with the photoresist material; wherein the ion beam comprises a beam current;
   measuring a pressure at the workpiece during the directing, wherein the pressure is indicative of the rate of outgassing;
   calculating an implanted dose for the workpiece after each pass of the ion beam;
   repeating the directing, measuring and calculating for a plurality of workpieces, each implanted using a different beam current; and
   determining the relationship between effective beam current, dose completed and the rate of outgassing based on the calculated implanted dose, the pressure and the beam current of each ion beam.

11. An ion implantation system, comprising:
   an ion source;
   a mass analyzer;
   a mass resolving device;
   a collimator;
   a movable workpiece holder; and
   a controller;
   wherein the controller comprises a memory device comprising instructions, which when executed by the controller enable the ion implantation system to:
      determine an effective beam current to be used for one or more passes as a workpiece coated with a photoresist material is implanted using a previously determined relationship between effective beam current, rate of outgassing and dose completed;
      implant ions of a certain species using the effective beam current during the one or more passes; and
      repeat the determine and implant a plurality of times.

12. The ion implantation system of claim 11, wherein the controller repeats the determine and implant until the effective beam current is equal to or greater than a maximum beam current that can be extracted from the ion source.

13. The ion implantation system of claim 12, wherein after the effective beam current is equal to or greater than the maximum beam current, the controller implants the ions using the maximum beam current until a desired dose has been implanted.

14. The ion implantation system of claim 11, wherein the controller varies the effective beam current after each pass until the effective beam current is equal to or greater than a maximum beam current that can be extracted from the ion source.

15. The ion implantation system of claim 11, wherein the workpiece is disposed on the movable workpiece holder and the controller varies the effective beam current by modifying a workpiece scan speed of the movable workpiece holder.

16. The ion implantation system of claim 11, wherein the ion source creates a spot beam and the ion implantation system comprises a scanner to create a ribbon ion beam from the spot beam; and the controller varies the effective beam current by modifying a beam scan frequency of the scanner.

17. The ion implantation system of claim 11, further comprising a blocker configured such that it may be moved so as to enter a path of the ions, and the controller varies the effective beam current by moving the blocker into the path of the ions to block some or all of the ions.

18. The ion implantation system of claim 11, wherein the previously determined relationship is determined by the controller by performing a calibration process.

19. The ion implantation system of claim 18, wherein the calibration process comprises:
   directing an ion beam of the certain species toward a workpiece, the workpiece coated with the photoresist material; wherein the ion beam comprises a beam current;
   measuring a pressure at the workpiece during the directing, wherein the pressure is indicative of the rate of outgassing;
   calculating an implanted dose for the workpiece after each pass of the ion beam;
   repeating the directing, measuring and calculating for a plurality of workpieces, each implanted using a different beam current; and
   determining a relationship between effective beam current, dose completed and the rate of outgassing based on the calculated implanted dose, the pressure and the beam current of each ion beam.

20. The ion implantation system of claim 11, wherein the controller varies the effective beam current without changing operating parameters of the ion source.

* * * * *